United States Patent
Wong et al.

(10) Patent No.: US 7,384,568 B2
(45) Date of Patent: Jun. 10, 2008

(54) METHOD OF FORMING A DARKFIELD ETCH MASK

(75) Inventors: William Wong, San Carlos, CA (US);
Scott Limb, Palo Alto, CA (US);
Beverly Russo, Sunnyvale, CA (US);
Michael Chabinyc, Burlingame, CA (US); Rene Lujan, Sunnyvale, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 246 days.

(21) Appl. No.: 11/394,438

(22) Filed: Mar. 31, 2006

(65) Prior Publication Data

US 2007/0235410 A1  Oct. 11, 2007

(51) Int. Cl.
*B44C 1/22*   (2006.01)
*C03C 25/68*  (2006.01)
*C03C 15/00*  (2006.01)
*C23F 1/00*   (2006.01)

(52) U.S. Cl. ............................... 216/41; 216/40

(58) Field of Classification Search ............... 216/41, 216/47, 40, 42, 23; 430/313, 5, 7
See application file for complete search history.

(56) References Cited

U.S. PATENT DOCUMENTS

| | | | |
|---|---|---|---|
| 3,958,252 A | 5/1976 | Kashio | |
| 4,131,899 A | 12/1978 | Christou | |
| 4,959,674 A | 9/1990 | Khuri-Yakub et al. | |
| 5,958,122 A | 9/1999 | Fukuda et al. | |
| 6,116,718 A | 9/2000 | Peeters et al. | |
| 6,742,884 B2 | 6/2004 | Wong et al. | |
| 6,759,713 B2 | 7/2004 | Chabinyc et al. | |
| 6,872,320 B2 | 3/2005 | Wong et al. | |
| 6,872,588 B2 | 3/2005 | Chabinyc et al. | |
| 6,890,050 B2 | 5/2005 | Ready et al. | |
| 6,972,261 B2 | 12/2005 | Wong et al. | |
| 2005/0136358 A1 | 6/2005 | Paul et al. | |
| 2006/0105492 A1* | 5/2006 | Veres et al. | ............... 438/99 |

* cited by examiner

*Primary Examiner*—Roberts Culbert
(74) *Attorney, Agent, or Firm*—Jonathan A. Small

(57) ABSTRACT

Susceptibility of darkfield etch masks (majority of the mask area is opaque) to pinhole defects, transferred pattern, non-uniformity, etc. due to ejector dropout or drop misdirection, and long duty cycles due to large-area coverage, when using digital lithography (or print patterning) is addressed by using a clear-field print pattern that is then coated with etch resist material. The printed clear field pattern is selectively removed to form an inverse pattern (darkfield) within the coated resist layer. Etching then removes selected portions of an underlying (e.g., encapsulation, conductive, etc.) layer. Removal of the mask produces a layer with large-area features with substantially reduced defects.

21 Claims, 13 Drawing Sheets

METHOD OF FORMING A DARKFIELD ETCH MASK

STATEMENT REGARDING FEDERALLY SPONSORED RESEARCH AND DEVELOPMENT

This invention was made with United States Government support under Cooperative Agreement 70NANB3H3029, awarded by the National Institute of Standards and Technology (NIST). The United States Government has certain rights in the invention.

CROSS-REFERENCE TO RELATED APPLICATIONS

The present invention is related to copending U.S. Applications for Letters Patent titled "Process For Forming A Feature By Undercutting A Printed Mask", Ser. No. 11/336,365, and "Additive Printed Mask Process And Structures Produced Thereby", Ser. No. 10/536,102, each assigned to the same assignee as the present application, and each incorporated herein by reference.

BACKGROUND OF THE INVENTION

1. Field of the Invention

This invention relates generally to electronic device fabrication processes, and more particularly to a method of creating an etch mask for masking regions of a layer from processing through the use of print patterning and an etch resistant material.

2. Description of the Prior Art.

Digital lithography (also known as print patterning) is a maturing technology designed to reduce the costs associated with photolithographic processes, used often in the fabrication of micro-electronic devices, integrated circuits, and related structures. Digital lithography directly deposits patterned material onto a substrate in place of the delicate and time-consuming lithography processes used in conventional manufacturing processes. The printed pattern produced by digital lithography can either comprise actual device features (i.e., elements that will be incorporated into the final device or circuitry, such as the source, drain, and gate regions of thin film transistors, signal lines, opto-electronic device components, etc.) or it can be a mask for subsequent semiconductor processing (e.g., etch, implant, etc.) Importantly, unlike traditional lithographic systems, digital lithography systems avoid the cost and challenges associates with the use of reticles or masks.

Typically, digital lithography involves depositing a print material by moving a printhead and a substrate relative to one another along a single axis (the "print travel axis"). Print heads, and in particular, the arrangements of the ejectors incorporated in those print heads, are optimized for printing along this print travel axis. Printing takes place in a raster fashion, with the print head making "printing passes" across the substrate as the ejector(s) in the print head dispense individual "droplets" of print material onto the substrate. Typically, the print head moves relative to the substrate in each printing pass, but the equivalent result may be obtained if the substrate is caused to move relative to the print head (for example, with the substrate secured to a moving stage) in a printing pass. At the end of each printing pass, the print head (or substrate) makes a perpendicular shift relative to the print travel axis before beginning a new printing pass. Printing passes continue in this manner until the desired pattern has been fully printed onto the substrate.

Materials typically printed by digital lithographic systems include phase change material, solutions of organic polymers, and suspensions of materials with desired electronic properties in a solvent or carrier. For example, U.S. Pat. Nos. 6,742,884 and 6,872,320 (each incorporated herein by reference) teach a system and process, respectively, for printing a phase change material onto a substrate for masking. According to these references, a suitable material, such as a stearyl erucamide wax, is maintained in liquid phase over an ink-jet style piezoelectric printhead, and selectively ejected on a droplet-by-droplet basis such that droplets of the wax are deposited in desired locations in a desired pattern on a layer formed over a substrate. The droplets exit the printhead in liquid form, then solidify after impacting the layer, hence the material is referred to as phase-change.

Once dispensed from an ejector, a print material droplet attaches itself to the substrate through a wetting action, then proceeds to solidify in place. In the case of printing phase-change materials, solidification occurs when a heated and liquefied printed droplet loses its thermal energy to the substrate and/or environment and reverts to a solid form. In the case of suspensions, after wetting to the substrate, the carrier most often either evaporates leaving the suspended material on the substrate surface or the carrier hardens or cures. The thermal conditions and physical properties of the print material and substrate, along with the ambient conditions and nature of the print material, determine the specific rate at which the deposited print material transforms from a liquid to a solid, and hence the height and profile of the solidified deposited material.

If two adjacent droplets are applied to the substrate within a time prior to the solidification of either or both droplets, the droplets may wet and coalesce together to form a single, continuous printed feature. Surface tension of the droplet material, temperature of the droplet at ejection, ambient temperature, and substrate temperature are key attributes for controlling the extent of droplet coalescence and lateral spreading of the coalesced material on the substrate surface. These attributes may be selected such that a desired feature size may be obtained.

According to known semiconductor masking fabrication techniques, layout is the process of defining the patterns that will be transferred to a mask, and as such will define the geometry of the device(s) to be lithographically formed. The "polarity" of the mask must be indicated as either brightfield (regions remaining after layout are transparent, also known as clearfield or lightfield) or darkfield (regions remaining after layout are opaque). Specification of the polarity of the layout must be accompanied by specification of the underlying photoresist, which is either positive (in which exposed areas are more susceptible to etching than unexposed areas), or negative (in which exposed areas are more resistant to etching than unexposed areas).

When print-patterning an etch mask, droplet coalescence is employed to control the width of the masking regions. Since print-patterning is a deposition process (as opposed to a removal process), traditionally, in order to produce large un-etched areas of underlying material, large areas of print-patterned material are deposited, with large scale coalescence forming the large area mask regions. These large areas of un-etched material are referred to herein as darkfields, and print-patterned etch masks facilitating the formation of such regions are referred to herein as print-patterned darkfield masks. Thus, for such a print-patterned darkfield etch mask, the majority of the mask is opaque.

The large-scale coalescence of droplets to produce opaque areas of print-patterned darkfield etch masks has presented the difficulty that such opaque areas are susceptible to various defects which fail to render the desired areas entirely opaque. For example, pinholes or other gaps in the mask area permit undesired processing of portions of the underlying layer(s). Print-patterned masks are particularly vulnerable to such defects, which result from print ejector drop out, droplet misdirection, incomplete coalescence, droplet size variations, etc. Misalignment and poorly defined edges are also undesirable consequences which may be encountered when forming large darkfield areas using print-patterned phase-change material masks. Furthermore, the printing of large areas with print-patterning material is a relatively slow process due to the relatively high number of droplets to be ejected and the time required for large-scale coalescence.

Thus, there is a need for a method of producing by digital lithography a darkfield etch mask having a reduced number of in-field defects. In particular, there has been a need for a method of producing such an improved darkfield mask maximizing use of conventional materials, processes, and fabrication devices. Furthermore, there has been a need to date for a method of more rapidly producing a print-patterned etch mask with large darkfield regions.

SUMMARY OF THE INVENTION

Accordingly, the present invention is directed to an inverse-pattern mask formed over a target layer. Etching is performed, using the inverse-pattern mask to prevent etching over desired areas, such that desired features are formed. Large areas of the target layer are shielded from etching by the inverse-pattern mask. Removal of the inverse-pattern mask leaves the desired topography of the target layer. Importantly, the desired large areas of target material are not masked by printed regions, but rather masked by a bulk-deposited etch resist, which itself is masked by printed regions, meaning the large areas remain substantially in their as-deposited condition, free of masking/etching artifacts such as pin-holes and other gaps.

According to one aspect of the present invention, a device, such as a thin-film transistor (TFT), is first formed on a substrate. An encapsulation later (e.g., of a dielectric material) is then deposited over the device and substrate, substantially covering both. A phase change material is then deposited by print-patterning onto the encapsulation layer overlying portions of the device to which contact (through the encapsulation layer) is ultimately desired. An etch resist layer is then be deposited over the structure, typically in the form of a spin-on resist, substantially embedding the phase change material. The resist is then cured by heating. At this point, portions of the print-patterned material are exposed through the top surface of the resist layer. Using these exposed portions as attack points, the print-patterned material is then selectively removed by a solvent, leaving a darkfield mask-patterned resist layer for masked etching through the encapsulation layer to the underlying device.

Etching is then performed, using the darkfield mask-patterned resist layer. The etchant reaches the encapsulation layer through the openings in the resist layer, and removes those portions of the encapsulation layer exposed by the removal of the print-patterned phase change material. The resist layer is then selectively removed, leaving an etched via in the encapsulation layer. A conductive metal may then be deposited in the via, creating an electrical interconnection to the underlying device. Such an arrangement may be useful, for example, for sensor or display applications.

Importantly, large-area regions of the encapsulation layer are substantially free of any of the aforementioned undesirable artifacts of the mask formation and etching processes, such as pinholes, gaps, and misalignment.

According to an alternative embodiment, a target film is initially deposited over a substrate. A phase-change material is deposited by print-patterning over the target film. An etch resist material is next applied over the structure, typically in the form of a spin-on resist, substantially embedding the phase change material. The resist is then cured by heating. Application of a solvent then removes the print-patterned phase-change material. The result is a resist layer having one or more cavities where the print-patterned phase-change material was once located. These cavities expose portions of the target layer underlying the resist layer.

Etching is then performed, using the resist as an etch mask. The etchant reaches the target layer through the cavities, thereby removing those portions of the target layer exposed by the removal of the print-patterned phase-change material. The resist layer is then selectively removed, leaving features, such as electronically isolative channels which may be used to define electronic components and interconnections, particularly when the target layer is formed, for example, of a conductive or semiconductive material. Importantly, large-area regions of the target layer are substantially free of any of the aforementioned undesirable artifacts of the mask formation and etching processes, such as pinholes, gaps, and misalignment.

Fine-featured structures may also be formed, for example adjacent a formed large-area region, by closely spacing separate regions of print-patterned material. The resist material will be deposited between the separate regions of print-patterned material, and mask a portion of the underlying target layer from subsequent removal.

The above is a summary of a number of the unique aspects, features, and advantages of the present invention. However, this summary is not exhaustive. Thus, these and other aspects, features, and advantages of the present invention will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION OF THE INVENTION

Described in the following section are specific steps for the formation of a print-patterned etch mask, and the production of structures formed with said mask. The structures so produced have large unetched areas substantially free from defects resulting from mask formation and etching. FIGS. 1A through 1K illustrate a first embodiment of a device at several intermediate stages of its production according to a process illustrated in FIG. 2. While the following description makes specific reference to the device illustrated in FIGS. 1A through 1K, without making more specific reference thereto the description is following the sequence illustrated in FIG. 2.

Figure 1A:
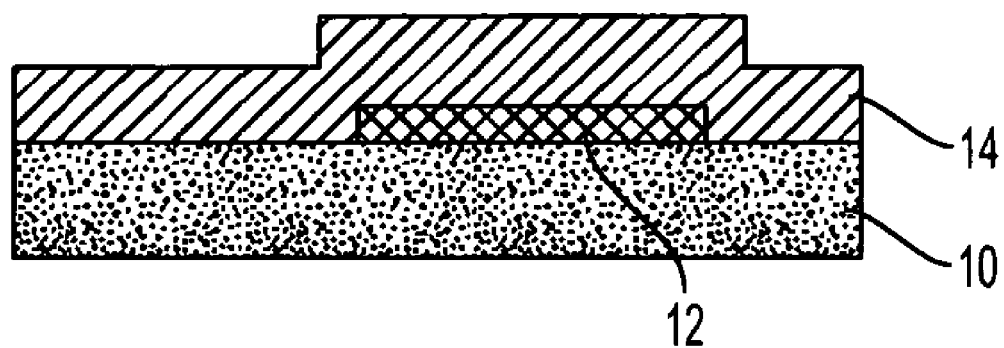
FIGS. 1A through 1F and 1H through K are cross-sectional views of an etch mask, and a structure produced with said mask, having large darkfield areas and an etched feature through which contact to an underlying electronic device(s) may be made, in successive stages of manufacture according one embodiment of-the present invention.
Figure 2:
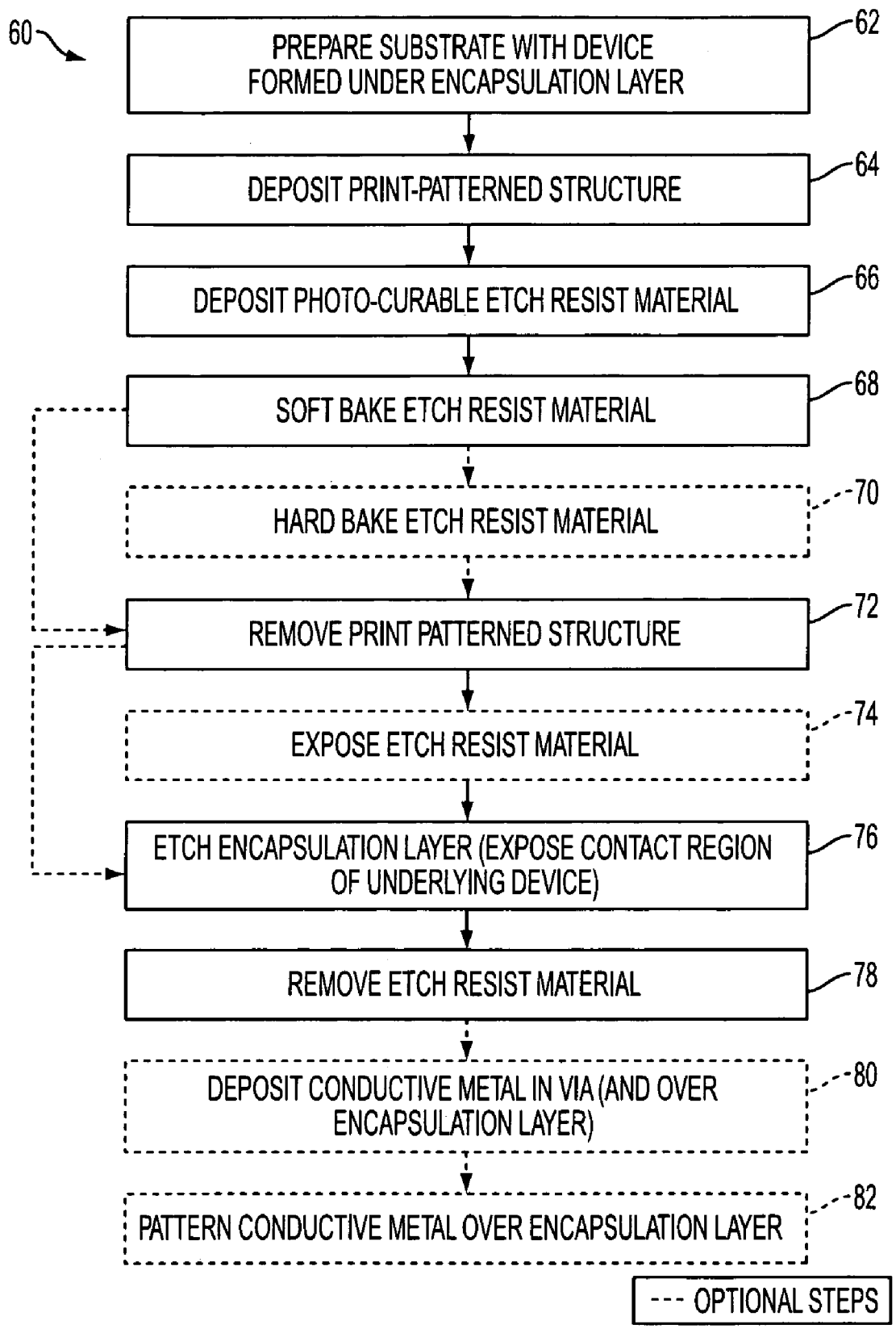
FIG. 2 is a flow diagram showing the steps of forming an etch mask, and a structure produced with said mask, having large darkfield areas and etched feature according one embodiment of the present invention.

With reference initially to FIG. 1A, the process begins with a suitable substrate 10, such as silicon, fused silica glass, quartz, sapphire, MgO, etc., on which is formed an electrical device 12, such as a TFT. In order to electrically isolate and physically protect electrical device 12, an encapsulation layer 14 is deposited over some or all of substrate 10 and electrical device 12. Encapsulation layer 14 may be relatively thick, e.g., 1 µm, as compared to electrical device 12, and will typically be a dielectric or insulative material such as silicon nitride, silicon dioxide, silicon oxynitrde, benzocyclobutene, SU-8 epoxy. Conventional deposition techniques may be employed to deposit layer 14, depending upon the material comprising the layer, such as chemical vapor deposition (CVD), plasma enhanced CVD (PECVD), spin-on coatings, etc.

Figure 1B:
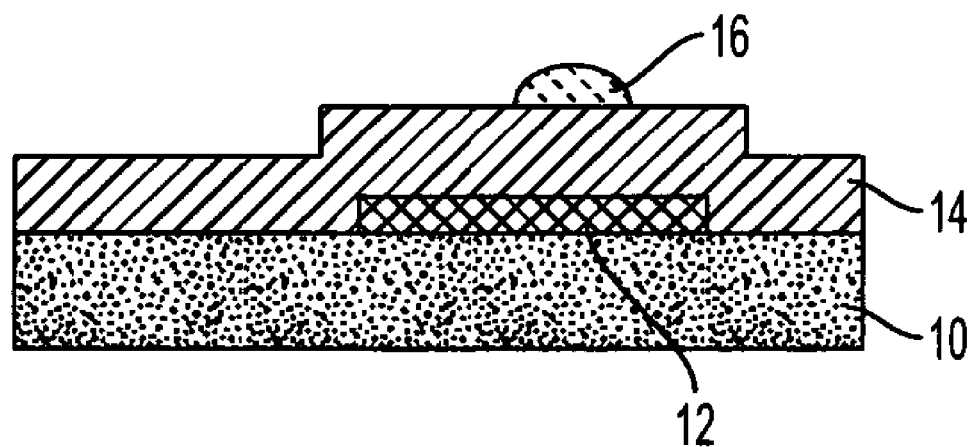

With reference now to FIG. 1B, a print-patterned structure 16 is formed over layer 14. Structure 16 is comprised of one or more droplets of a phase change material such as stearyl erucamide wax (for example, Kemamide 180-based wax from Crompton Corporation of Middlebury, Conn.) Individual droplets may be isolated from one another or coalesced into structures. Examples of systems appropriate for the ejection of droplets of phase change material include: ink-jet systems (such as disclosed in U.S. Pat. No. 4,131,899, which is incorporated herein by reference), ballistic aerosol marking (BAM) devices (such as disclosed in U.S. Pat. No. 6,116,718, which is incorporated herein by reference), acoustic ink printer (AIP) systems (U.S. Pat. No. 4,959,674, which is incorporated herein by reference), carrier-jet ejectors (as disclosed in U.S. Pat. No. 5,958,122, which is incorporated by reference herein), deflection-controlled ink-jet systems (such as disclosed in U.S. Pat. No. 3,958,252, which is incorporated herein by reference), etc. Such systems also include pattern transfer systems, such as: xerographic, ionographic, screen, contact, and gravure printing systems, etc.

The embodiment discussed herein involves the formation of a print-patterned mask over underlying layers containing previously formed devices or structures. Such devices may have specific configurations, requiring positional registration of the deposition of print-patterned material 16 in order to facilitate subsequent electrical interconnection. Registration is routinely accomplished in digital lithographic systems by use of fiduciary marks, digital imaging and processing, and processor controlled relative motion of the ejector and the substrate. The ability to align the mask layer through image processing prior to patterning is a significant advantage of the digital-lithographic process over other masking methods. The size and shape of the solidified droplets are also critical to operation of the present invention. Thus, in addition to alignment, attention must be paid to droplet ejection temperature, wetting at the substrate (characteristics of the surface onto which the droplets are ejected), proximity to adjacent droplets, and the temperature of the substrate.

According to the present embodiment, print-patterned structure 16 is a single structure having an oval, rectangular or similar planform. It may be on the order of 20-50 microns in width and height, and it's length (the dimension into the sheet in the figures) may vary depending, for example, upon the nature and size of device 12 and the role of the feature ultimately being formed. For print-patterned structure of this scale or larger, individual or coalesced droplets may serve to define the width of the etched region. For devices requiring narrower features, indirect techniques such as that disclosed in U.S. patent application Ser. No. 11/193,847, which is incorporated herein by reference, may be combined with the present disclosure.

Figure 1C:
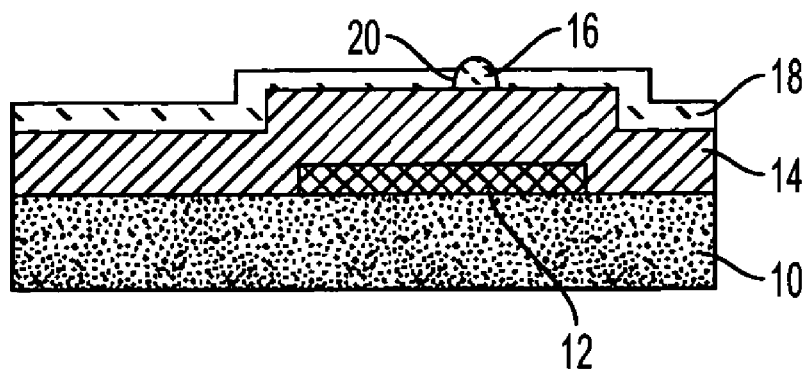
Figure 1D:
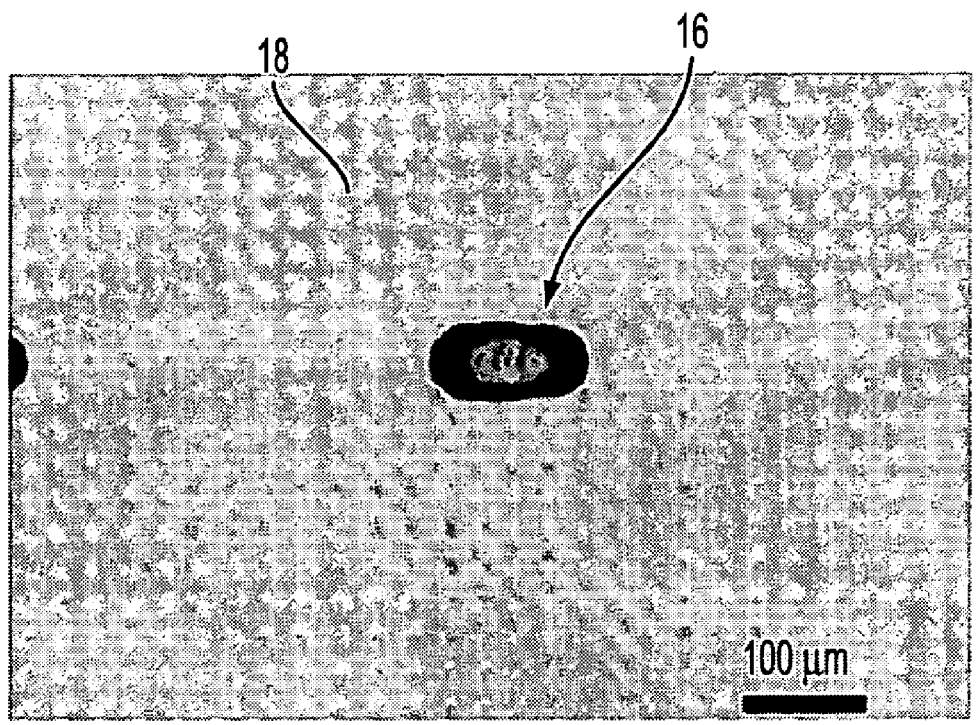

With reference next to FIG. 1C, a layer 18 of etch resist material is next deposited, typically by spin-coating the material. Layer 18 may be a photo-sensitive resist, such as a positive, UV-sensitive photoresist typically used in the manufacture of IC devices, for example Shipley 1813 (Shipley Microelectronics division of Rohm and Haas, www.rohmhaas.com). Another material which may be employed is a vinylidene chloride-co-acrylonitrile, for example as sold under the trade name Saran by the Dow Chemical Company (www.dow.com). Layer 18 is deposited sufficiently thick to at least substantially, if not completely cover print-patterned structure 16, for example on the order of 0.5-10 µm. Although not shown in the figures, conventional adhesion promotion layers such as HMDS (hexamethaldisilaxane) known in the photolithographic art may optionally be employed prior to deposition of resist layer 18 in order to improve the bond between resist layer 18 and device 12/encapsulation layer 14. Other methods for surface preparation which may be appropriate in certain applications of the present invention are annealing and plasma cleaning followed by an HMDS coating in order to clean and prepare the surface for photoresist adhesion. FIG. 1D is an optical micrograph of a resist coated structure (Saran/Kemamide-based wax).

The structure illustrated in FIG. 1C is then heated to a temperature just below the melting temperature of the phase change material forming structure 16, for example approximately 50° C. for 30 minutes. This so-called soft bake at least partially, if not substantially cures and hardens the resist layer 18, and enhances the effectiveness of the subsequent step of selectively removing the phase change material while leaving the etch resist substantially in place. The print-patterned structure 16 provides a form, similar to that used in a molding process, around which the resist material hardens during curing. Furthermore, if the phase change material melts during the soft bake (i.e., if the soft bake temperature is above the melting point of the phase change material) the solvents in the uncured etch mask and the phase change material will intermix and the feature size of the resulting mask will be larger due to phase change material spreading and solvent intermixing, and may in fact disrupt the entire mask formation process. Therefore, at this point it is important that the print-patterned material not melt or flow during the soft bake. Accordingly, the material forming print-patterned structure 16 must be selected such that it's melting temperature is above the soft-bake temperature of the resist material. With the proper selection of print-patterned material, resist material, and soft bake temperatures, the cure-hardened resist forms a cavity 20 effectively filled with the print-patterned material.

Resist layer 18 substantially covers encapsulation layer 14 but due to the volume of resist material deposited and the nature of the print-patterned material, the resist layer 18 overlying structure 16 is either exceptionally thin or only partially covers structure 16 (with gaps in the coverage). The soft bake essentially preserves the as-deposited form of the resist layer 18.

Figure 1E:
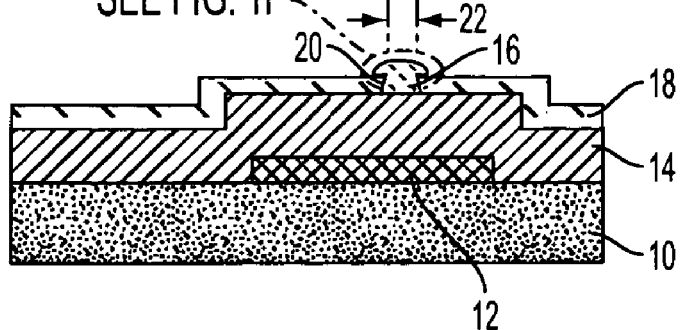
Figure 1F:
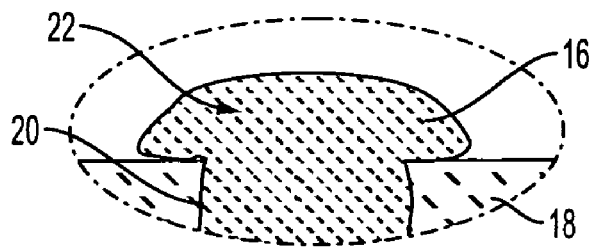
Figure 1G:
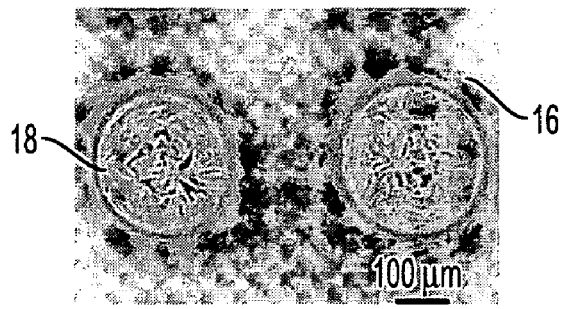
FIG. 1G is a top view optical micrograph of two print-patterned structured following hard bake, according one embodiment of the present invention.
Figure 1H:
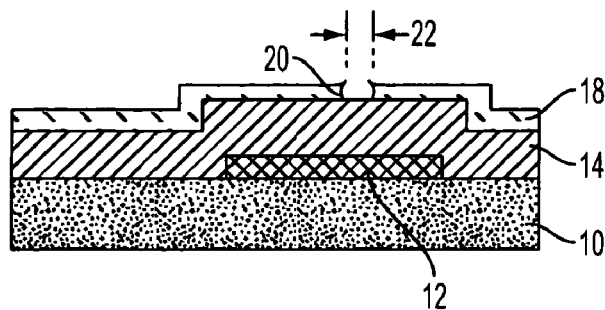
Figure 1I:
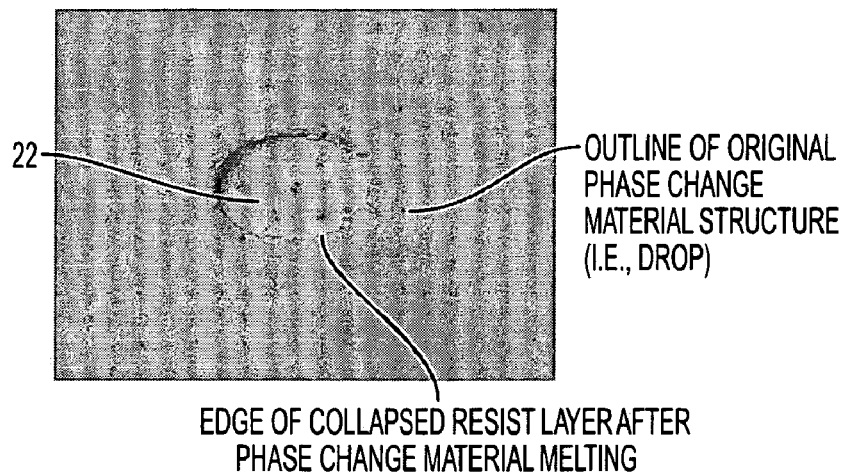

The next step in the process is illustrated in FIGS. 1E and 1F, which show a structure that has been subject to a shorter but higher temperature bake, referred to as a hard bake, then cooled. The hard bake causes the phase change material constituting structure 16 to melt. The molten phase change material tends to minimize its surface energy by spreading or balling up, depending on the interface between the overlying etch-resist layer and the exposed molten phase change material surface. The etch resist may be thought of as a "skin" that is torn when the phase change material melts. We believe that the resist is thinnest around the top-most area of the phase change material constituting structure 16. When the phase change material melts, the overlying structure breaks apart and collapses (something like a volcano forming a caldera), as illustrated in the micrograph of FIG. 1I, discussed further below. An opening is thereby provided, exposing the molten phase change material and permitting it to flow over the etch resist layer. Once cooled, the phase change material forms a structure having a roughly umbrella-shaped cross-section, as shown in detail in FIG. 1F. The modified shape of structure 16 provides increased surface area (and in some cases gaps between the phase change material and resist layer 18) which form attack points for the next step of removing the phase change material. FIG. 1G is a top view optical micrograph of the structure after hard bake, at typically 150° C.

Print-patterned structure 16 may then be removed by a method appropriate to the print-patterned material employed. For example, in the event that the print-patterned material is a stearyl erucamide wax, a heated solvent such as acetone may be employed. Alternatives include SVC-28 debonding solution, manufactured by Rohm-Hass (dipropylene glycol monomethyl ether, citrus distillate, synthetic isoparraffinic hydrocarbon, and aliphatic hydrocarbon, www.rohmhaas.com), and for the aforementioned Saran, PGMEA (propylene glycol monomethyl ether acetate). We have also found that SRX-400 Advanced Debonding Agent (available from ROHM and HAAS Electronic Materials, Marlborough, Mass. works for the phase change material removal. SRX-400 is a replacement product for SVC-28 from Rohm-Hass. (The main ingredients for SRX-400 is Aromatic hydrocarbon 50.0% and Aliphatic hydrocarbon 50.0%.) The solvent selectively removes the phase change material, substantially leaving the resist material and underlying encapsulation material unaffected. The large surface area of the "umbrella" (and any locations where the phase change material has separated from the walls of cavity 22 due to melting during the hard bake step) enhance the uniformity and increasing the rate at which the phase change material is removed by the solvent. The structure is exposed to the solvent for a time sufficient to permit the solvent to entirely remove the phase change material. The resulting structure is effectively an inverse mask, as shown in FIG. 1H.

FIG. 1I is an optical micrograph of the resulting structure, showing the opening through which the molten phase change material passed. FIG. 1I also shows a jagged circumference of this opening, providing evidence that resist originally overlaying the phase change material broke away from the main resist structure.

It is also possible to combine the method of melting the phase change material (hard bake) with the step of removing the phase change material (e.g., dipping the structure into a heated solvent bath). The simultaneous heating and solvent application breaks the resist structure (if any) overlying the phase change material, and strips the phase change material in a single step.

Optionally, resist layer 18 is next flood exposed to UV or appropriate radiation to cross link the resist material molecules. However, we have found that the process described herein is also effective without such a UV exposure step.

Figure 1J:
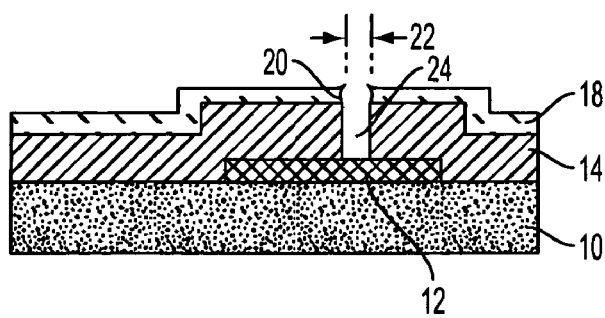

Resist layer 18 may then be used as an etch mask to selectively etch portions of encapsulation layer 14 exposed by cavity 22. Etching of the Si-based dielectric materials (e.g., nitride, oxide, and oxynitride) is accomplished in a wet etchant based on hydrofluoric acid. Other methods that can be used are dry plasma etchants based on a mixture carbon tetraflouride and oxygen gas. One advantage of the present invention is that a conventional etching processes can be used for a wide range of materials, since the etch mask is based on conventional etch resist materials (but patterned by digital lithography). The etched structure appears substantially as shown in FIG. 1J, with a via 24 now formed in encapsulation layer 14, extending to a desired location such as a contact pad (not shown) on electrical device 12.

With via 24 now formed, resist layer 18 may be removed by processes and with materials well known in the art. For typical photo resist materials, SVC-150 [ROHM and HAAS Electronic Materials, Marlborough, Mass.] at 75° C. may effectively remove the photoresist without affecting the encapsulation layer 14 and exposed portion of device 12. An acetone stripper may be employed for this purpose when the aforementioned Saran is used for layer 18. The structure at this point in the process is substantially as shown in FIG. 1J.

Figure 1K:
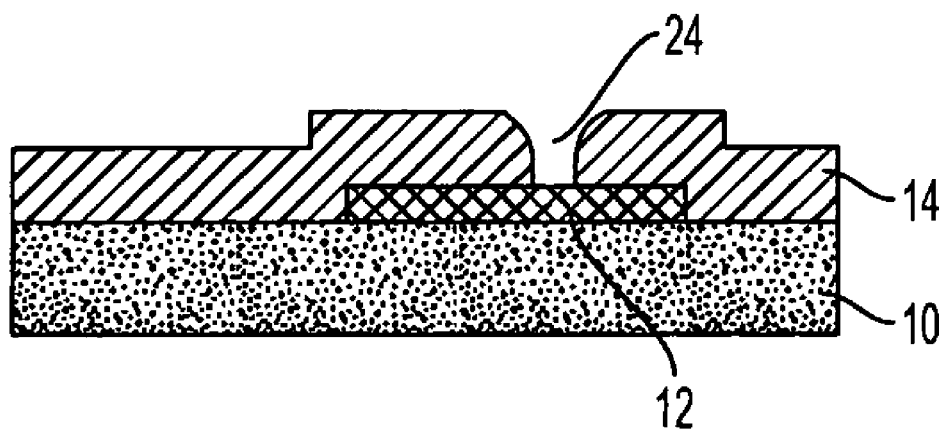
Figure 1L:
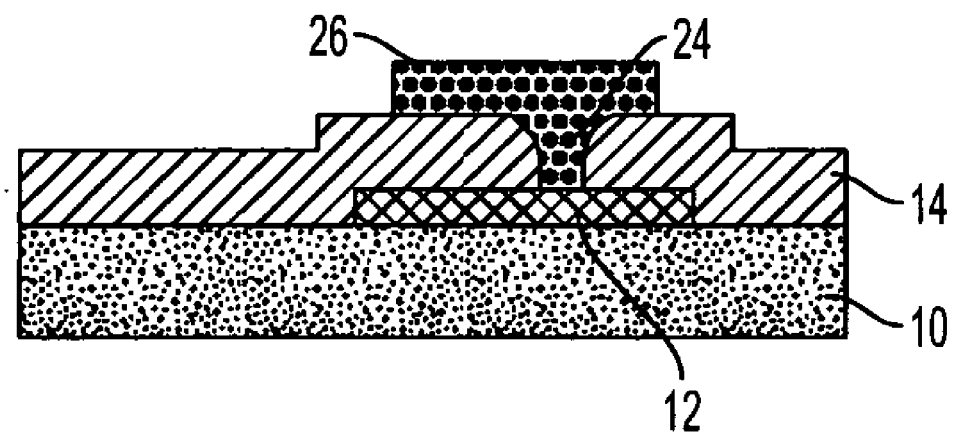

A patterned conductive or semiconductive layer 26 may then be formed over the structure as illustrated in FIG. 1K. Any required cleaning and surface preparation may first take place, then layer 26 deposited by sputtering, CVD, plating or other appropriate technique. Patterning of layer 26 may be via lithography, a print-patterned process or other technique know in the art. Layer 26, which makes electrical contact with device 12 through via 24, may form a sensor element, media control contact for a display device, bus contact line or other structure, with additional processing steps as may be appropriate.

According to another embodiment of the present invention, masked etching of a target layer formed over a substrate, and formation of large area and adjacent structures may be accomplished by a method similar to that described above. FIGS. 3A through 3K illustrate an embodiment of a device-at several intermediate stages of its production according to a process illustrated in FIG. 4. While the following description makes specific reference to the device illustrated in FIGS. 3A through 3K, without making more specific reference thereto the description is following the sequence illustrated in FIG. 4.

Figure 3A:
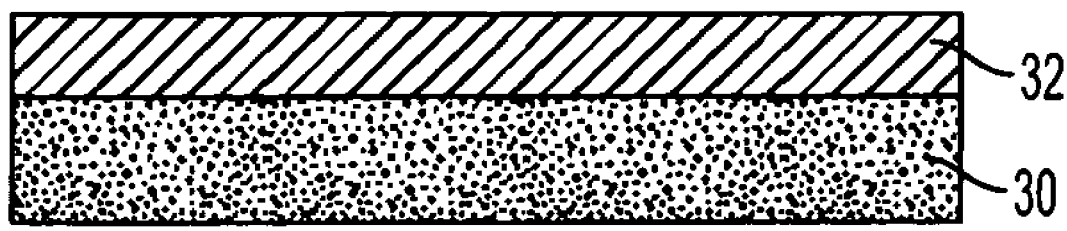
FIGS. 3A through 3K are cross-sectional views of an etch mask, and a structure produced with said mask, having large darkfield areas and an isolated adjacent structure, in successive stages of manufacture according another embodiment of the present invention.
Figure 4:
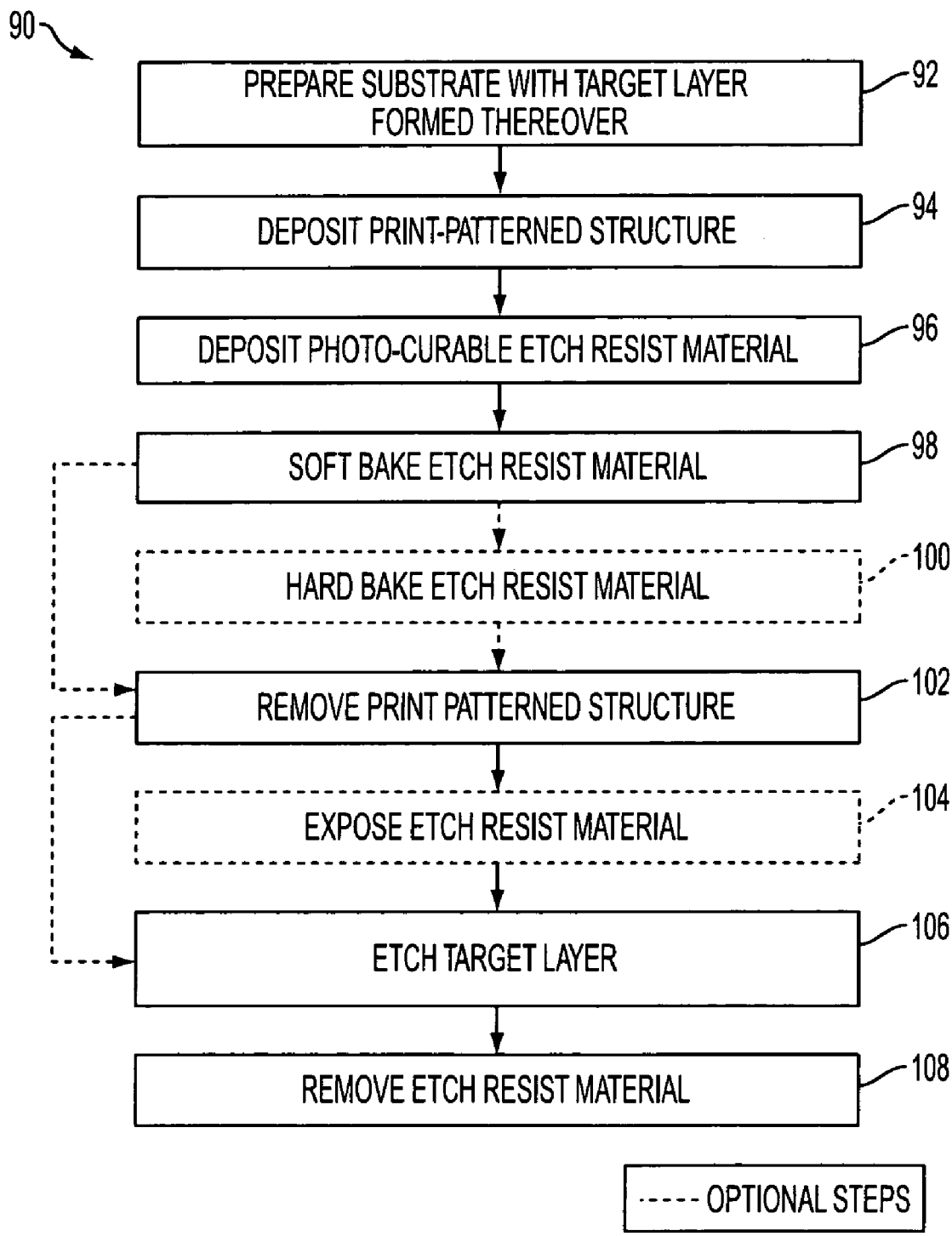
FIG. 4 is a flow diagram showing the steps of forming an etch mask, and a structure produced with said mask, having large darkfield areas and etched feature of a type illustrated in FIG. 3 according another embodiment of the present invention.

With reference now to FIG. 3A, the process according to this embodiment begins with a suitable substrate 30, such as silicon, fused silica glass, quartz, sapphire, MgO, etc. A target layer 32 is formed over substrate 30. Target layer 32 may be conductive, semiconductive, or insulative, the material and dimensions of the layer depending on the application of the final structure. It should also be noted that intermediate layers (not shown) may also be formed over substrate 30 prior to formation of target layer 32, again depending on the application of the final structure.

Figure 3B:
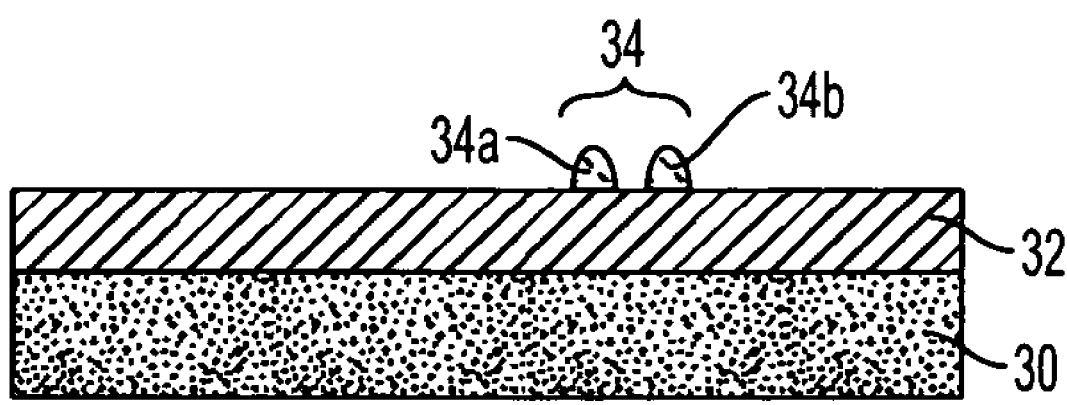

A print-patterned structure 34 is formed over target layer 32, by any of the aforementioned devices and methods, as illustrated in FIG. 3B. Structure 34 is comprised of one or more droplets of a phase change material such as stearyl erucamide, wax (for example, Kemamide 180-based wax from Crompton Corporation of Middlebury, Conn.) Individual droplets may be isolated from one another or coalesced into structures. For illustrative purposes, structure 34 is represented as two individual, adjacent but not contiguous structures of phase change material 34a, 34b. However, it will be appreciated that the process described and illustrated herein operates equally with 1 or more than 2 droplets, and with discrete and coalesced droplets, as may be appropriate for a particular application. Typical droplet sizes are on the order of 20-50 microns in width and height. For features of this scale or larger, individual or coalesced droplets may serve to define the width of the etched region. Again, for devices requiring narrower features, other indirect techniques such as that disclosed in the aforementioned U.S. patent application Ser. No. 11/193,847 may be combined with the present disclosure.

Figure 3C:
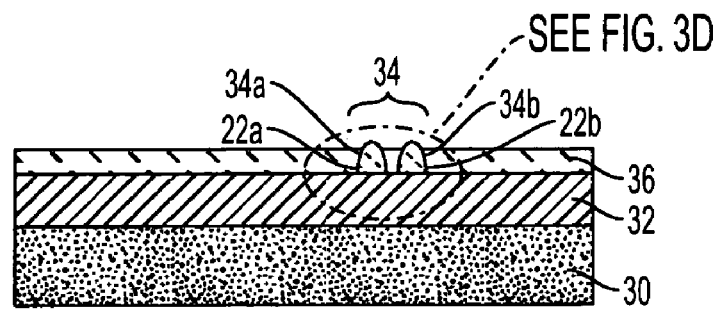

With reference to FIG. 3C, a layer 36 of etch resist material is next deposited, typically by spin-coating the material. Layer 36 may be a photo-sensitive resist, such as a positive, UV-sensitive photoresist typically used in the manufacture of IC devices, for example the aforementioned Shipley 1813 or Saran. Layer 36 is deposited sufficiently thick to at least substantially, if not complete cover print-patterned structure 34, for example on the order of 0.5-10 μm. Although not shown in the figures, conventional adhesion promotion layers such as HMDS (hexamethaldisilaxane) known in the photo resist art may optionally be employed prior to deposition of the resist layer in order to improve the bond between the resist and the target layer. Other methods for surface preparation are annealing and plasma cleaning followed by an HMDS coating in order to clean and prepare the surface for photoresist adhesion.

The structure illustrated in FIG. 3C is then soft baked at a temperature just below the melting temperature of the phase change material forming structure 34, for example approximately 50° C. for 30 minutes. The print-patterned structure 34 provides a form around which the resist material hardens during curing. With the proper selection of print-patterned material, resist material, and soft bake temperatures, the cure-hardened resist forms cavities 38a, 38b effectively filled with the print-patterned material.

Figure 3D:
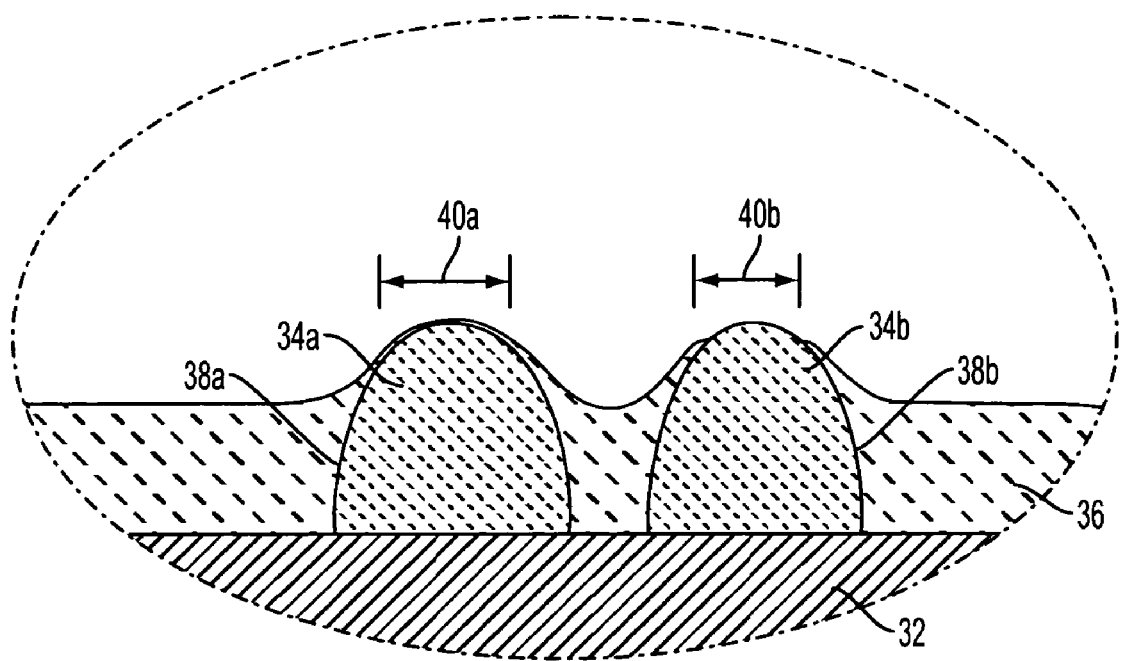

FIG. 3D is a magnified view of a portion of the structure shown in FIG. 3C. Resist layer 36 substantially covers target layer 32, including the region between structures 34a and 34b, but due to the volume of resist material deposited and the nature of the print-patterned material, the resist layer 36 overlying structures 34a and 34b is either exceptionally thin, as shown in region 40a or it does not completely cover the structure as shown in region 40b. While shown as either completely covered (region 40a) or uncovered (region 40b) in FIG. 3D, resist layer may also only partially cover a phase change material structure (not shown) during the resist deposition process. The soft bake essentially preserves the as-deposited form of the resist layer 18.

Figure 3E:
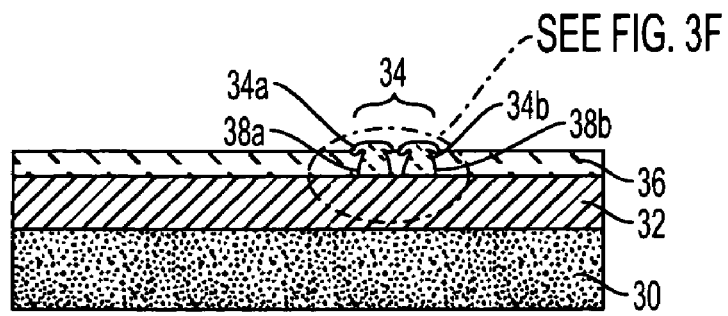
Figure 3F:
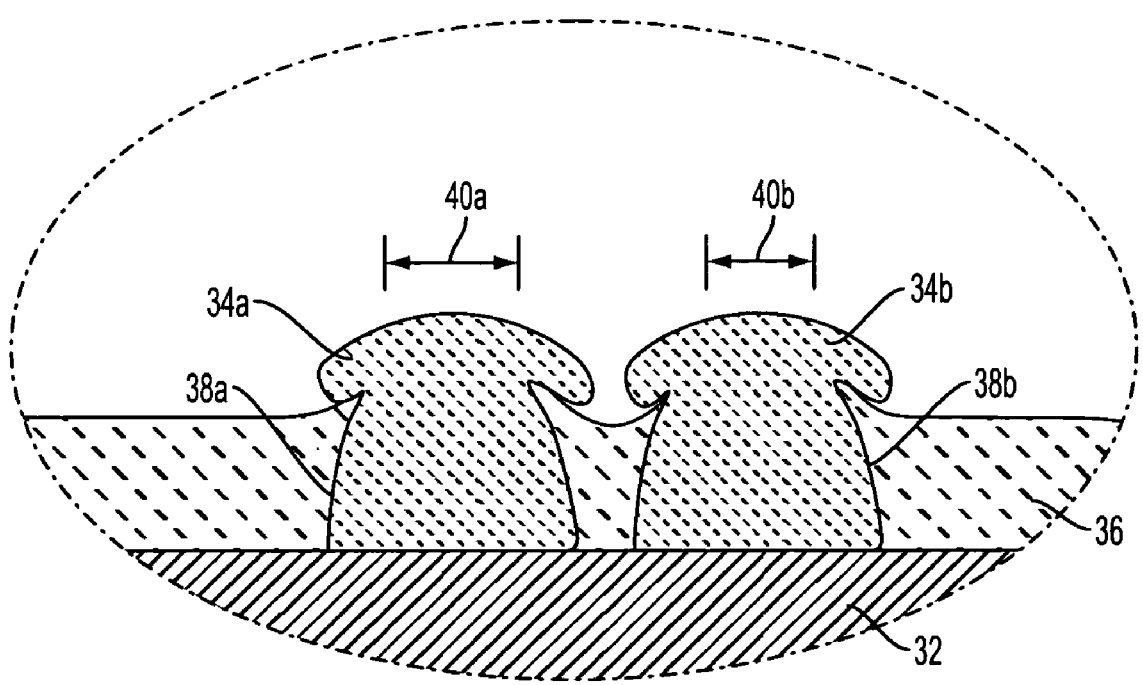

The next step in the process is illustrated in FIGS. 3E and 2F. The structure illustrated in FIG. 3E has been subject to a hard bake. The phase change material constituting structures 34a, 34b has been melted by the hard bake, and caused to flow out of cavities 38a, 38b. Once cooled, phase change material structures 34a and 34b have a roughly umbrella-shaped cross-section, providing increased surface area and attack points for the next step of removing the phase change material. FIG. 3F is a magnified view of a portion of the structure shown in FIG. 3E illustrating this umbrella profile.

Figure 3G:
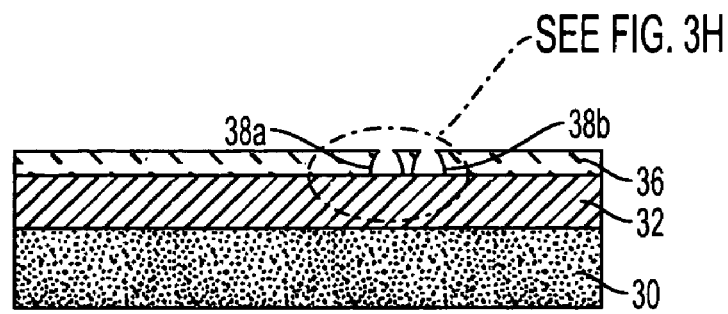
Figure 3H:
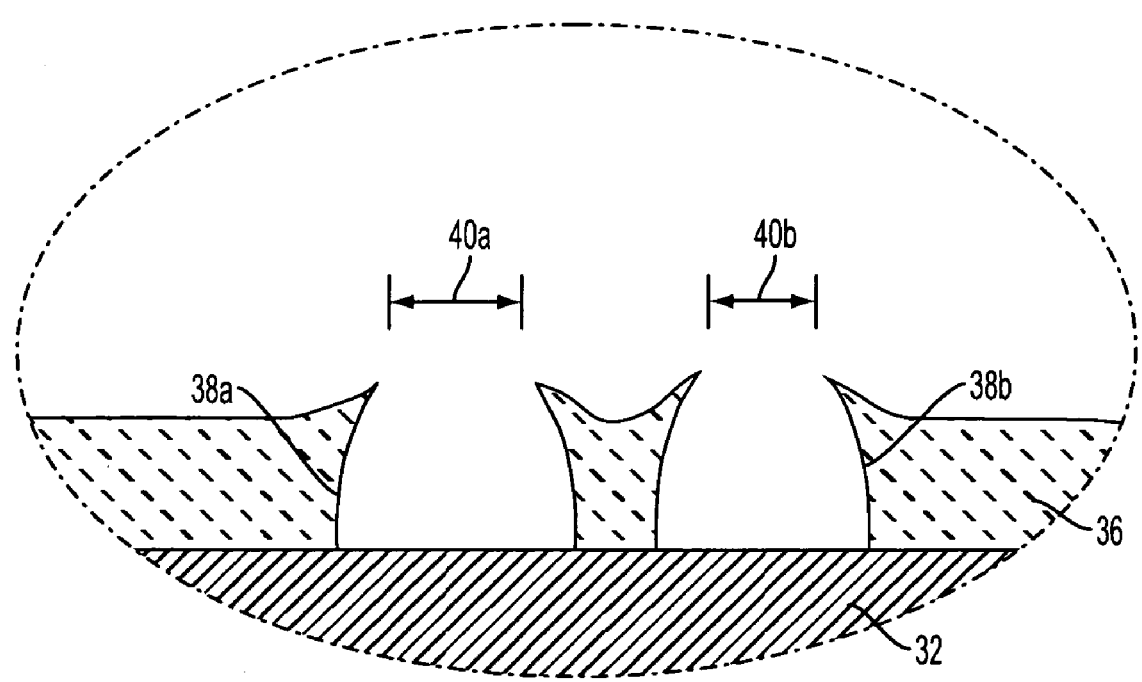

Print-patterned structure 34 may then be removed by a method appropriate to the print-patterned material employed. For example, in the event that the print-patterned material is a stearyl erucamide wax, a heated solvent such as acetone, SVC-28, etc. may be used, or for the aforementioned Saran, PGMEA (propylene glycol monomethyl ether acetate). The solvent selectively removes the phase change material forming structures 34a, 34b. The large surface area of the "umbrella" and any locations where the phase change material has separated from the walls of cavities 38a, 38b due to melting during the hard bake step enhance the uniformity and increasing the rate at which the droplets are removed by the solvent. The structure is exposed to the solvent for a time sufficient to permit the solvent to entirely remove the phase change material. Again, the hard bake and removal steps may be combined into a single step, such as immersion of the structure into a solvent bath heated above the melting temperature of the phase change material. The resulting structure is effectively an inverse mask, as shown in FIGS. 3G and 2H.

Figure 3I:
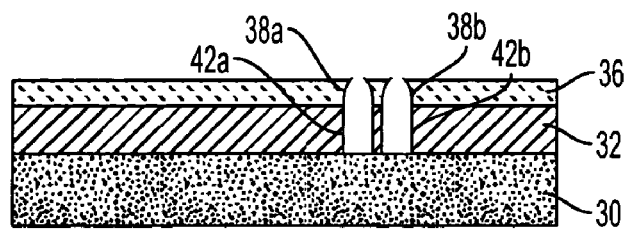

Optionally, resist layer 36 may next be flood exposed to UV or appropriate radiation to cross link the resist material molecules. However, we have found that according to one embodiment of the present invention, exposure of the resist material is not necessary, as it may function as an etch mask in its unexposed state. Resist layer 36 may then be used as an etch mask to selectively etch portions of target layer 32 exposed by cavities 38a, 38b. The metal etching is typically done by a wet chemical etch, although some select metals can also be etched by dry plasma etching. Again, the process described allows for the use of a wide variety of industry standard etch materials. The preference in industry is to do all etching dry to reduce waste. The etched structure appears substantially as shown in FIG. 3I, with cavities 42a, 42b now formed in target layer 32.

Figure 3J:
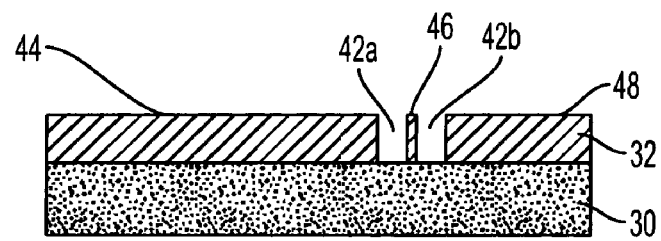

With cavities 42a, 42b now formed, resist layer 36 may be removed by processes and with materials well known in the art. The material used to remove resist layer 36 will depend in part on the material forming target layer 32. Typically, SVC-150 ROHM and HAAS Electronic Materials, Marlborough, Mass. at 75° C. is a candidate for this removal step (and possibly an acetone stripper may be employed for this purpose when the aforementioned Saran is used for layer 36). The structure at this point in the process is substantially as shown in FIG. 3J. From target layer 32 several discrete structures 44, 46, 48 have been formed, each in their as-deposited state, free of mask and etching-related artifacts.

Figure 3K:
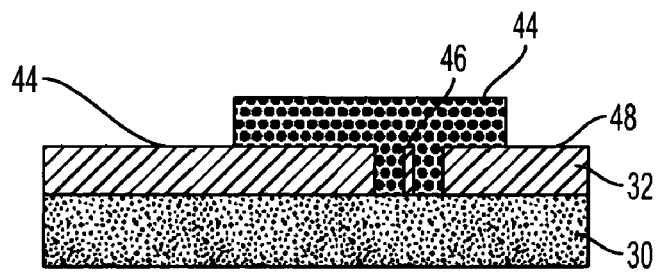

Optionally, a patterned insulative, semiconductive or conductive material 50 may then be formed over the structure as illustrated in FIG. 3K. Any required cleaning and surface preparation may first take place, then layer 50 may be deposited by sputtering, CVD, plating or other appropriate technique. Patterning of layer 50 may be via lithography, a print-patterned process or other technique know in the art.

Thus, the present embodiment has formed a planar structure having a plurality of electrically discrete structures 44, 46, 48. One or more of the structures may have a relatively surface large-area by photolithographic standards, be formed by print-patterning, and yet be completely free from typical masking and etching defects found in large-area structures formed by print patterning. And while the preceding description has resulted in a device having two structures, 44, 48 separated by a relatively much smaller structure 46 (for example, structure 46 having a width less than the width of an individual print patterned feature), such a structure is intended for illustrative purposes only, and it is within the spirit and scope of the present invention that there may be any number of structures formed between structures 44 and 48, from no such interstitial structure to many, depending on the number of print-patterned features formed.

Figure 5:
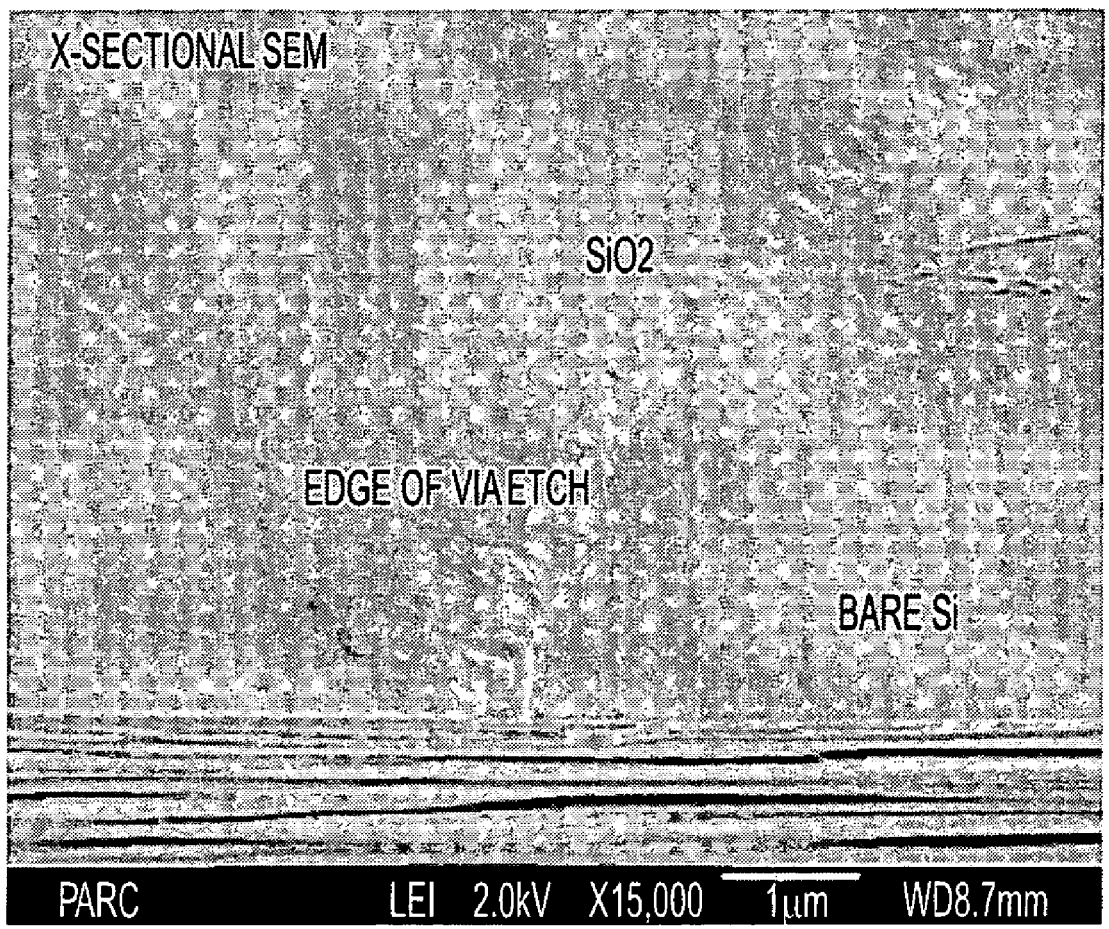
FIG. 5 is an optical micrograph of an etched structure illustrating the profile of the via/cavity formed according to one embodiment of the process of the present invention.

A noteworthy artifact of the present invention is the profile of the via/cavity formed by using cavities 20 (FIG. 1I) and 38a, 38b (FIG. 3J) as a clearfield mask for etching underlying layers. Since the phase change material used as molds to form these cavities have roughly convex cross-sections tapering in with elevation, the walls of the cavities are correspondingly concave. A concave profile for the via desirably permits deposition of subsequent layers in continuous contact from the bottom to top of the via. A tapered sidewall facilitates layer deposition covering the via feature conformally from the bottom, up the sidewall, to the top surface of the via. This profile is illustrated in FIG. 5, which is a cross-section of an etched feature with a tapered sidewall having a concave profile, similar to that formed by conventional photolithographic processes.

While a plurality of preferred exemplary embodiments have been presented in the foregoing detailed description, it should be understood that a vast number of variations exist, and these preferred exemplary embodiments are merely representative examples, and are not intended to limit the scope, applicability or configuration of the invention in any way. For example, the print-patterned features may be formed in the pattern of a grid defining an array of cells, and the subsequent etching of the underlying layer producing a border structure defining a plurality of individual, isolated cells which with additional processing may, for example, form a display or sensor structure. In addition, it will be appreciated that our process may be employed with multiple layer structures and sequentially on layers stacked above one another. Thus, the foregoing detailed description provides those of ordinary skill in the art with a convenient guide for implementation of the invention, and contemplates that various changes in the functions and arrangements of the described embodiments may be made without departing from the spirit and scope of the invention defined by the claims thereto.

What is claimed is:

1. A method of manufacturing an etched structure, comprising the steps of:
   forming over a target layer a print-patterned structure, said print-patterned structure formed of a material having a melting temperature;
   depositing over said target layer and said print-patterned structure an etch resist layer;
   thermally curing said etch resist layer at a temperature below the melting temperature of the material forming said print-patterned structure so as to harden said etch resist layer;
   removing said print-patterned structure such that said etch resist layer forms a darkfield etch mask; and
   etching said target layer, using a selected etchant and said darkfield etch mask.

2. The method of claim 1, wherein said print patterned structure is formed of a phase change material.

3. The method of claim 2, wherein said phase change material is a stearyl erucamide wax.

4. The method of claim 1, further comprising the step of removing said etch resist layer following the step of etching said target layer.

5. The method of claim 1, further comprising the step, following the step of thermally curing said etch resist layer and prior to the step of removing said print-patterned structure, of heating said etch resist layer and said print-patterned structure to a temperature above the melting temperature of the material forming said print-patterned structure such that the material forming said print-patterned structure melts and at least partially separates from said etch resist layer.

6. The method of claim 1, wherein the step of removing said print-patterned structure comprises exposing said print-patterned structure to a heated solvent, the temperature of the solvent being above the melting temperature of the material forming the print-patterned structure.

7. The method of claim 5 wherein said etch resist layer is deposited such that that portion thereof formed over said print-patterned structure includes gaps through which the print-patterned structure is exposed, and further wherein the step of heating said etch resist layer and said print-patterned structure to a temperature above the melting temperature of the material forming said print-patterned structure causes said material forming said print-patterned structure to partially flow out of said gaps.

8. The method of claim 1 wherein said darkfield etch mask includes a cavity located where the print-patterned material was disposed, said cavity having a tapered profile along its elevation.

9. The method of claim 8 wherein said tapered profile is concave.

10. A method of manufacturing an etched structure, comprising the steps of:
    forming over a target layer a print-patterned structure, said print-patterned structure formed of a stearyl erucamide wax material having a melting temperature;
    depositing over said target layer and said print-patterned structure an etch resist layer such that that portion thereof formed over said print-patterned structure includes gaps through which the print-patterned structure is exposed;
    thermally curing said etch resist layer at a temperature below the melting temperature of the stearyl erucamide wax so as to harden said etch resist layer;
    heating said etch resist layer and said print-patterned structure to a temperature above the melting temperature of the stearyl erucamide wax such that the stearyl erucamide wax melts and at least partially separates from said etch resist layer and such that said stearyl erucamide wax is caused to partially flow out of said gaps;
    removing said print-patterned structure such that said etch resist layer forms a darkfield etch mask said having a cavity located where said print-patterned material was disposed;
    etching said target layer, using said darkfield etch mask; and
    removing said etch resist layer.

11. The method of claim 10, wherein the steps of heating said etch resist layer and said print-patterned structure to a temperature above the melting temperature of the stearyl erucamide wax and removing said print-patterned structure are performed together in a single step comprising immersing the structure in a heated solvent bath, the temperature of the solvent bath being above the melting temperature of the stearyl erucamide wax.

12. A method of forming a via in a layer for contacting a portion of structure underlying an encapsulation layer, comprising the steps of:
    forming over the encapsulation layer a print-patterned structure, said print-patterned structure formed of a material having a melting temperature, said print-patterned structure disposed at least over a contact portion of said structure to be contacted;
    depositing over said encapsulation layer and said print-patterned structure an etch resist layer;
    thermally curing said etch resist layer at a temperature below the melting temperature of the material forming said print-patterned structure so as to harden said etch resist layer;
    removing said print-patterned structure such that said etch resist layer forms a darkfield etch mask; and
    etching said encapsulation layer, using a selected etchant and said darkfield etch mask, to form a via exposing said contact portion of said structure to be contacted.

13. The method of claim 12, further comprising the step of exposing said etch resist layer such that said etch resist layer becomes resistant to said selected etchant.

14. The method of claim 12 further comprising the steps, following the step of etching said encapsulation layer, of removing said darkfield etch mask and depositing a conductive material in said via for making electrical contact to said contact portion of said structure to be contacted.

15. The method of claim 12, wherein said print patterned structure is formed of a phase change material.

16. The method of claim 15, wherein said phase change material is a stearyl erucamide wax.

17. The method of claim 12, further comprising the step, following the step of thermally curing said etch resist layer and prior to the step of removing said print-patterned structure, of heating said etch resist layer and said print-patterned structure to a temperature above the melting temperature of the material forming said print-patterned structure such that the material forming said print-patterned structure melts and at least partially separates from said etch resist layer.

18. The method of claim 17, wherein said etch resist layer is deposited such that that portion thereof formed over said print-patterned structure includes gaps through which the print-patterned structure is exposed, and further wherein the step of heating said etch resist layer and said print-patterned structure to a temperature above the melting temperature of the material forming said print-patterned structure causes said material forming said print-patterned structure to partially flow out of said gaps.

19. The method of claim 12, wherein the step of removing said print-patterned structure comprises exposing said print-patterned structure to a heated solvent, the temperature of the solvent being above the melting temperature of the material forming the print-patterned structure.

20. The method of claim 12 wherein said darkfield etch mask includes a cavity located where the print-patterned material was disposed, said cavity having a tapered profile along its elevation.

21. The method of claim 20 wherein said tapered profile is concave.

* * * * *